(12) United States Patent
Beyne et al.

(10) Patent No.: US 12,745,627 B2
(45) Date of Patent: Sep. 22, 2026

(54) SEMICONDUCTOR COMPONENT WITH METAL-INSULATOR-METAL CAPACITOR ASSEMBLY

(71) Applicant: IMEC VZW, Leuven (BE)

(72) Inventors: Eric Beyne, Heverlee (BE); Philip Nolmans, Hoeleden (BE); Kenichi Miyaguchi, Heverlee (BE)

(73) Assignee: IMEC VZW, Leuven (BE)

( * ) Notice: Subject to any disclaimer, the term of this patent is extended or adjusted under 35 U.S.C. 154(b) by 355 days.

(21) Appl. No.: 18/545,256

(22) Filed: Dec. 19, 2023

(65) Prior Publication Data

US 2024/0222260 A1 Jul. 4, 2024

(30) Foreign Application Priority Data

Dec. 19, 2022 (EP) .................................... 22214723

(51) Int. Cl.

| | |
|---|---|
| ***H01L 23/522*** | (2006.01) |
| ***H10D 1/00*** | (2025.01) |
| ***H10D 1/68*** | (2025.01) |
| ***H10W 20/40*** | (2026.01) |

(52) U.S. Cl.

CPC .......... *H10W 20/495* (2026.01); *H10D 1/042* (2025.01); *H10D 1/714* (2025.01); *H10D 1/716* (2025.01)

(58) Field of Classification Search

CPC ..... H10W 20/495; H10D 1/716; H10D 1/042; H10D 1/714

USPC .......................................................... 257/532

See application file for complete search history.

(56) References Cited

U.S. PATENT DOCUMENTS

| | | | |
|---|---|---|---|
| 2015/0115401 | A1 | 4/2015 | Zhang et al. |
| 2017/0104057 | A1 | 4/2017 | Voiron |
| 2020/0176552 | A1 | 6/2020 | Chang |

OTHER PUBLICATIONS

Extended European Search Report dated Jun. 5, 2023 in European Application No. 22214723.3, in 5 pages.

Chen et al., "Backside PDN and 2.5D MIMCAP to Double Boost 2D and 3D ICs IR-Drop beyond 2nm Node", 2022 Symposium on VLSI Technology & Circuits Digest of Technical Papers, pp. 429-430.

Hwang et al., "Implementation of high density embedded 3-Dimensional MIM Capacitor integrated in compatible logic process", Proceedings of the 2016 28th International Symposium on Power Semiconductor Devices and ICs (ISPSD), Jun. 12-16, 2016, Prague, Czech Republic, pp. 431-434.

(Continued)

*Primary Examiner* — Dzung Tran

(74) *Attorney, Agent, or Firm* — Knobbe Martens Olson & Bear, LLP

(57) ABSTRACT

The disclosed technology is related to semiconductor components, including a multilayer structure with a plurality of MIM capacitors. The capacitors are realized as an assembly of capacitors in the form of a stack of at least three electrically conductive layers, separated by dielectric layers and formed conformally on a topography defined by a plurality of dielectric pillars distributed on a conductive bottom plate formed on a first level of the multilayer interconnect structure. By realizing a height difference between different pillars or different groups of pillars, the intermediate ayers of the stack become available for contacting the layers by via connections.

7 Claims, 8 Drawing Sheets

(56) References Cited

OTHER PUBLICATIONS

Lin et al., "91.5%-Efficiency Fully Integrated Voltage Regulator with 86fF/$\mu m^2$-High-Density 2.5D MIM Capacitor", 2021 Symposium on VLSI Technology Digest of Technical Papers, paper T9-2, in 2 pages.

Marknäs et al., "Reliability, solderability and electrical performance of high density ultra thin capacitors based on carbon nanofibers", 2021 IEEE 71st Electronic Components and Technology Conference (ECTC), pp. 1627-1632.

Roda Neve et al., "High-Density and Low-Leakage Novel Embedded 3D MIM capacitor on Si Interposer", 2016 IEEE International 3D Systems Integration Conference (3DIC), San Francisco, CA, USA, 2016, pp. 1-4.

Thomas et al., "Reliable 3D Damascene MIM architecture embedded into Cu interconnect for a $Ta_2O_5$ capacitor record density of 17 fF/$\mu m^2$", 2007 Symposium on VLSI Technology Digest of Technical Papers, pp. 58-59.

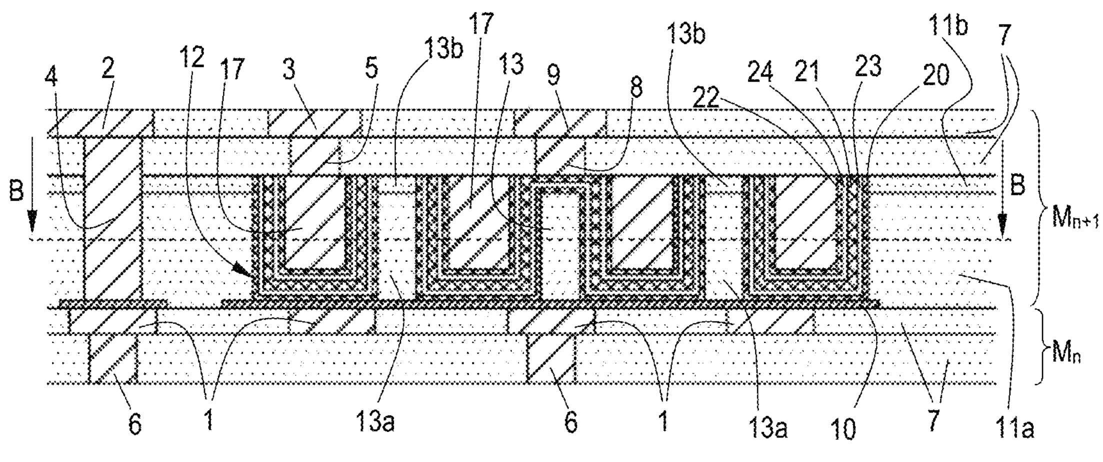
FIG. 2a
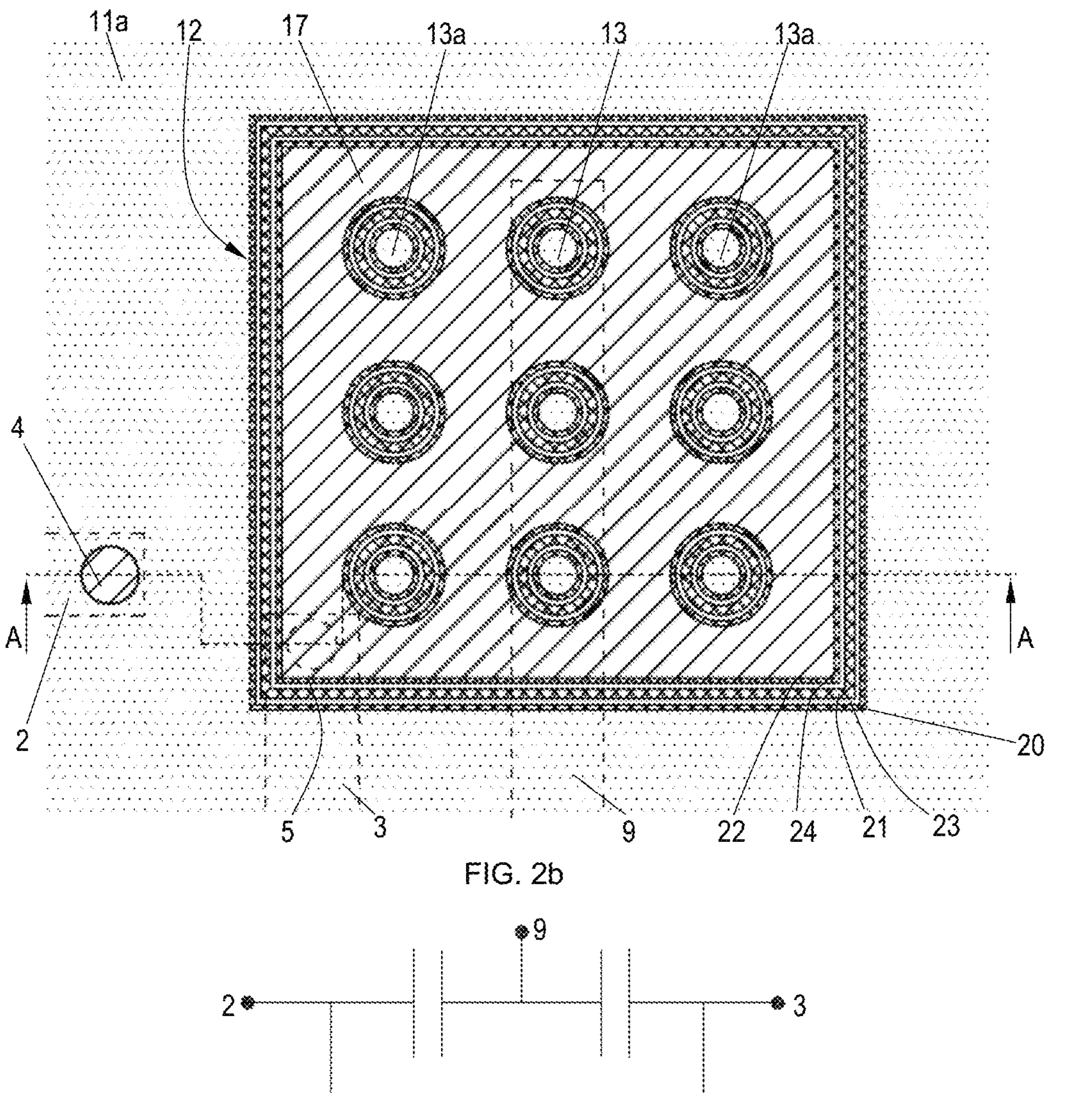
FIG. 2b
FIG. 2c

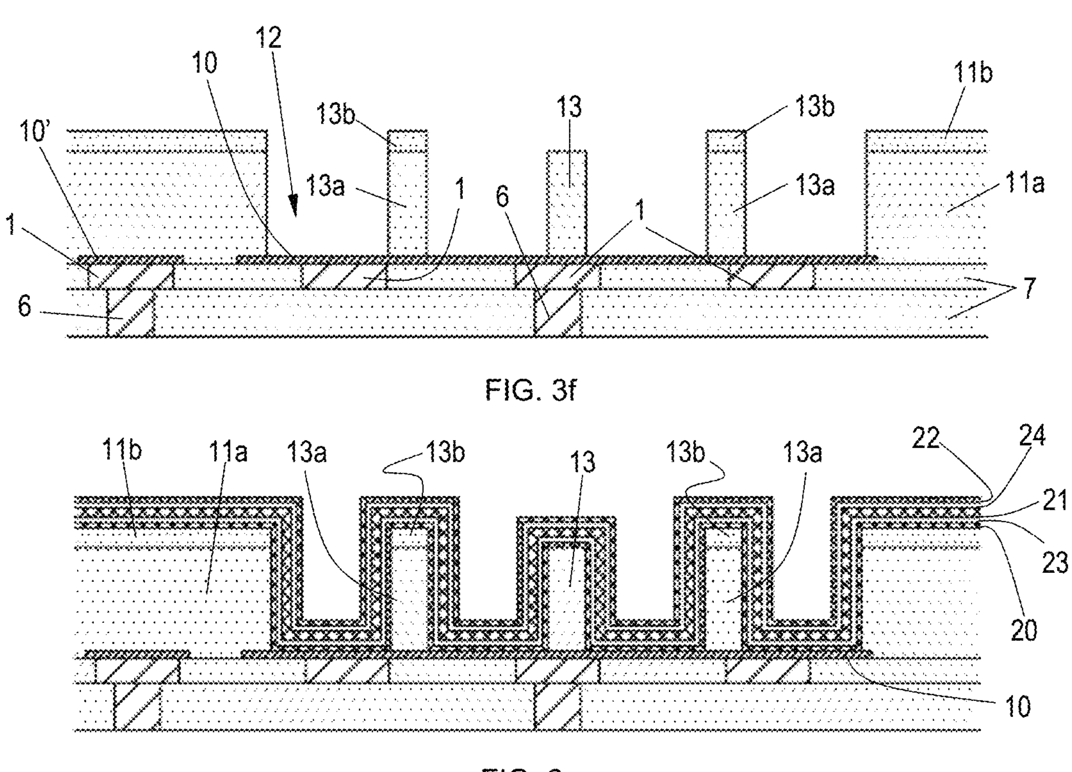
FIG. 3f
FIG. 3g
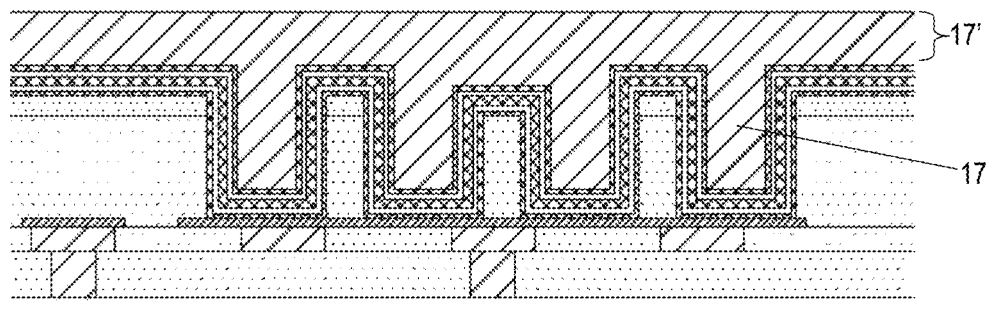
FIG. 3h
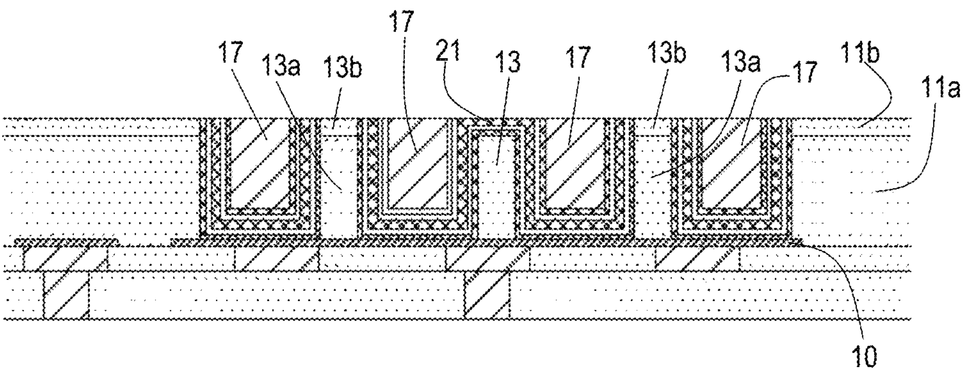
FIG. 3i

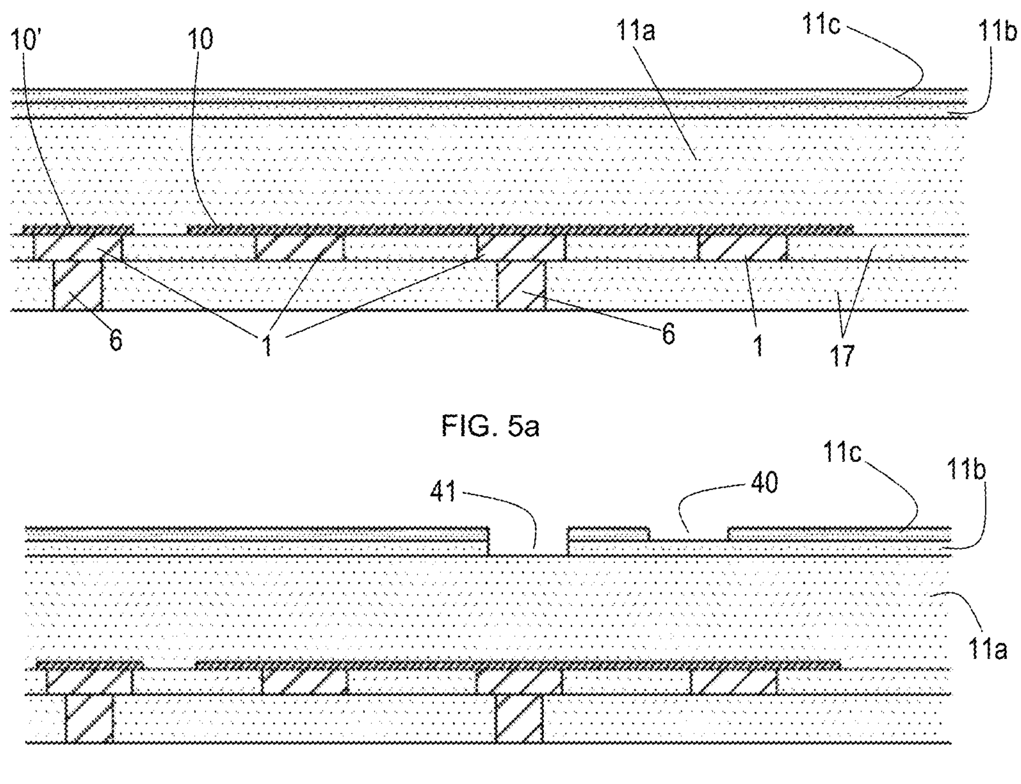
FIG. 5a
FIG. 5b
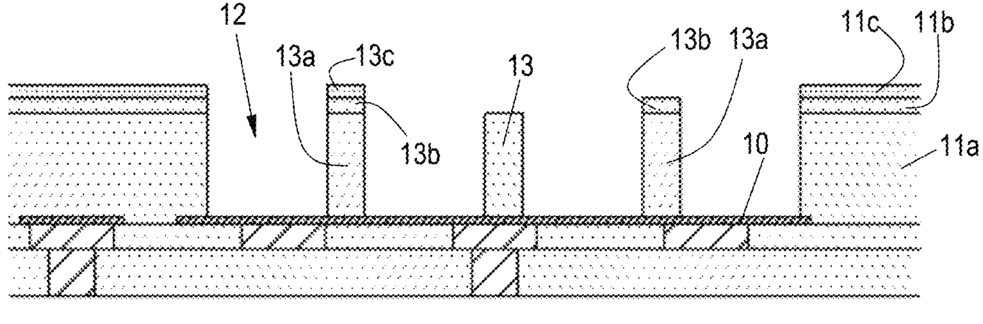
FIG. 5c
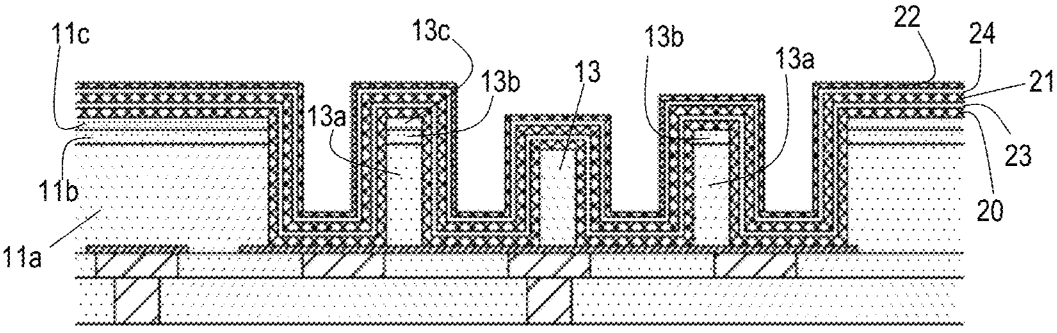
FIG. 5d

SEMICONDUCTOR COMPONENT WITH METAL-INSULATOR-METAL CAPACITOR ASSEMBLY

CROSS-REFERENCE TO RELATED APPLICATIONS

This application claims foreign priority to European Application No. 22214723.3, filed Dec. 19, 2022, which is incorporated by reference herein in its entirety.

BACKGROUND

Field

The disclosed technology is generally relates to integrated circuit (IC) component, and more particularly to the integration of large-area capacitors in an interconnect structure of the IC component.

Description of the Related Technology

A semiconduction IC components can include multilayer interconnect structures. These structures can include multiple layers of nanometre-to-micrometre-sized conductor lines interconnected by vertical via connections and embedded in a dielectric material. The main application for this type of structure is the so-called back end of line (BEOL) portion of IC chips. The BEOL portion can connect the active devices, such as transistors and diodes which have been fabricated on the front side of the semiconductor substrate portion of the chip, to contact terminals on the top side of the chip. The BEOL type structures can be found on the back side of the chip, such as in the form of a back side power delivery network connected to the active devices of the chip by through-semiconductor via (TSV) connections. BEOL type structures can also be found on larger components, such as interposer chips.

The large area capacitors in a BEOL type interconnect structure can generally be used to regulate the power supply of the chip, such as in charge pumps or other types of integrated voltage regulators. This large area capacitor can generally be referred to as metal-insulator-metal capacitor ("MIMcap"). The MIMcap can be assembled with two layers of electrically conductive materials separated by a thin dielectric. The disclosed technology does not limit the type of materials used in the MIMcap.

The MIMcap's capacitance value can be defined based on the effective surface area and the ratio of the dielectric constant to the thickness of the dielectric of the MIMcap. For example, implementing the dielectric material with a high dielectric constant value with a very thin layer of the dielectric can result in a high capacitance value. However, this type of dielectric material may decrease the capacitor quality and cause an increase in leakage current or a decrease in breakdown voltage and reliability. Therefore, to ensure the capacitor quality, an increment of the capacitance values can be achieved by increasing the effective surface area. However, the planar MIMcap has design limitations for achieving the large effective surface area due to the limitation of the available surface area on the chips.

Larger surface areas can be obtained by non-planar MIMcaps. One recent design of the non-planar MIMcaps describes a regular array of dielectric pillars on a conductive bottom layer and depositing the layers of the MIMcap conformally on the topography defined by the pillars, followed by filling the areas between the pillars by a layer of copper, planarizing the copper and the layers of the MIMcap and providing contacts to the top and bottom plates of the MIMcap. In this design, the term "2.5D" has been introduced to refer to the pillars and to distinguish the structure from what is commonly referred to as 3D MIMcaps, which involve trench-type structures extending into the silicon substrate. The limitation associated with the 3D MIMcaps is that they are likely cause unwanted coupling effects between the MIMcap and the substrate.

The 2.5 MIMcaps also have technical challenges. More specifically, the 2.5D structure realizes a considerable increase in the surface area compared to planar MIMcaps, while also realizing an effective decoupling of the capacitor from the silicon substrate. However, the increase in the capacitance by using a larger aspect ratio of the dielectric pillars represents a considerable technical challenge.

SUMMARY OF CERTAIN INVENTIVE ASPECTS

In the view of the above, an objective of the disclosed technology is to provide one or more solutions to the technical challenge associated with designing a MIMcap structure having an increased capacitance. This objective can be achieved by the capacitor assembly as disclosed in accordance with one or more embodiments disclosed herein. More specifically, the disclosed technology relates to semiconductor components, such as integrated circuit chips or interposer chips, including a multilayer structure, such as a back end of line portion, with a plurality of MIM capacitors integrated between two levels of the multilayer structure. The capacitors can be realized as an assembly of capacitors in the form of a stack of at least three electrically conductive layers. These conductive layers can be separated by one or more dielectric layers and formed conformally on a topography defined by a plurality of dielectric pillars distributed on a bottom conductive plate formed on a first level of the multilayer interconnect structure. By realizing a height difference between each pillar or each group of pillars, the intermediate conductive layers of the stack can become available for contacting the layers by via connections of the next level of the interconnect structure. In this way, an IC including multiple parallel capacitors can be realized, which significantly can increase the capacitance of the overall assembly. The method of the disclosed technology can include the deposition of a thick dielectric layer and one or more additional dielectric layers thereon. Openings are produced in the additional layers before patterning the layers to form the pillars, so that the thicknesses of the additional layers can determine the height differences between the pillars. By controlling the thicknesses in relation to the thicknesses of the layers of the capacitor assembly, contacting of the intermediate conductive layers of the stack can be enabled.

The disclosed technology is related in particular to a semiconductor component, including a multilayer interconnect structure. The multilayer interconnect structure includes multiple levels of electrical conductor lines and via connections embedded in layers of dielectric material. The multilayer interconnect structure also includes an electrically conductive bottom plate, on and in electrically conductive contact with one or more conductor lines of a first level of the interconnect structure, a dielectric layer that is part of a second level of the interconnect structure lying directly above the first level, wherein the dielectric layer is lying directly on the bottom plate and includes a cavity through its full thickness and lying within the boundaries of the bottom plate. The multilayer interconnect structure can also include a plurality of pillars of dielectric material distributed on the bottom plate, and is characterized in that the interconnect structure further includes a stack of layers including at least three electrically conductive layers, a bottom layer, a top layer, and at least one intermediate layer. The stack of layers further includes dielectric layers which separate the conductive layers from each other, and the layers of the stack follow the topography defined by the bottom plate, the sidewalls of the pillars, and the sidewalls of the cavity. The multilayer interconnect structure also includes a continuous layer of electrically conductive material that fills the remaining volume of the cavity and is in direct contact with the top conductive layer of the stack. The pillars or several subgroups of pillars have different heights, and the height differences are conFig.d that each intermediate conductive layer of the stack and all layers of the stack lying beneath the intermediate layer additionally follow the topography defined by the top surface of one or more pillars, the upper surface of each intermediate layer is coplanar with the upper surface of the continuous conductive layer in separate areas above the top surfaces of the one or more pillars, a plurality of via connections of the second level of the interconnect structure. The plurality of via connections includes one or more via connections which are in direct contact with the upper surface of the continuous conductive layer, one or more via connections which are in direct contact with the intermediate conductive layers of the stack in the one or more separate areas, one or more via connections which are in direct or indirect contact with the bottom conductive layer of the stack. The stack of layers forms an assembly of capacitors that each capacitor includes two electrodes and a dielectric, formed by two adjacent conductive layers of the stack and their separating dielectric layer. The bottom electrode of the capacitor assembly, the top electrode of the capacitor assembly, and each intermediate electrode can be connected through the plurality of via connections of the second level of the interconnect structure. In some embodiments, the bottom electrode of the capacitor assembly, the top electrode of the capacitor assembly, and each intermediate layer can be connected through the plurality of via connections of the second level of the interconnect structure.

According to one or more embodiments of the disclosed technology, the component can include one or more pillars whose height is conFig.d so that the bottom conductive layer of the stack follows the topography defined by the upper surface of the pillars. The bottom conductive layer can be coplanar with the continuous conductive layer in respective additional separate areas lying above the one or more pillars, and one or more via connections of the second level can be in direct contact with the bottom conductive layer in the additional areas.

According to one or more embodiments of the disclosed technology, the second level can include one or more via connections which are in indirect contact with the bottom conductive layer of the stack, and the indirect contact is realized by the one or more via connections pass through the dielectric layer, the one or more via connections are in electrical contact with a conductor line of the first level, and the conductor line in electrical contact with the bottom plate.

According to one or more embodiments of the disclosed technology, the component can be a semiconductor chip, and the interconnect structure can be a BEOL portion formed on the front side of the chip.

According to one or more embodiments of the disclosed technology, the component can be a semiconductor chip, and the interconnect structure is a power delivery network formed on the back side of the chip.

According to one or more embodiments of the disclosed technology, the stack of capacitors can include at least two capacitors coupled in parallel.

The disclosed technology is also related to a method for producing a stack of capacitors incorporated in an interconnect structure of a semiconductor component. The structure includes multiple levels of electrical conductor lines and via connections embedded in layers of dielectric material. The method includes the steps of: producing a level $M_n$ of the interconnect structure with n lower than the total number of levels, thereby obtaining a planarized surface including conductor lines of level $M_n$ embedded in and coplanar with a dielectric layer; producing an electrically conductive bottom plate on the planarized surface and in direct contact with one or more of the conductor lines; producing a first dielectric layer on the bottom plate and on the rest of the planarized surface; producing at least one additional dielectric layer on the first dielectric layer that the additional layer or layers being thin in comparison with the first layer; producing one or more first openings in the upper additional layer by locally removing material of the upper layer in a region above the bottom plate without substantially removing any material of the layer lying directly under the upper layer; if more than one additional layer is present, producing in the region one or more second openings separate from the first openings by locally removing material of the upper layer and the layer lying under the upper layer without substantially removing any material of the next layer; if more than two additional layers are present, repeating the previous step until reaching the first dielectric layer, by lithography and etching, removing the material of the first and additional dielectric layers in an area having a circumference that surrounds all the openings, except in predefined portions of the openings, thereby creating a cavity that lies within the outer boundaries of the bottom plate, with pillars of dielectric material remaining on the bottom of the cavity, the pillars having different heights in accordance with the number of additional layers produced on the first dielectric layer; producing a stack of layers on the topography defined by the cavity and the pillars, the stack including at least three electrically conductive layers, including a bottom layer, a top layer and at least one intermediate layer, wherein the stack further includes dielectric layers which separate the conductive layers from each other, and wherein the layers of the stack are conformal layers, such as layers which follow the topography defined by the cavity and the pillars; filling the remaining volume of the cavity with an electrically conductive material, wherein the electrically conductive material is in direct contact with the top conductive layer; planarizing the electrically conductive material and the stack to the level of the top additional dielectric layer or slightly beyond the level, to thereby create a planarized continuous conductive layer, wherein the thicknesses of the one or more additional dielectric layers are conFig.d in relation to the thicknesses of the layers of the stack, so that each of the intermediate conductive layers of the stack is planarized to the same level as the continuous conductive layer, in respective separate areas above a plurality of pillars which are lower than the level of the top additional layer; producing interconnect vias of the subsequent level $M_{n+1}$ of the interconnect structure, including: one or more via connections which are in direct contact with the upper surface of the continuous conductive layer, one or more via connections which are in direct contact with the intermediate conductive layers of the stack, in the one or more separate areas, and one or more via connections which are in direct or indirect contact with the bottom conductive layer of the stack.

BRIEF DESCRIPTION OF THE DRAWINGS

The above described aspects and implementations are explained in the following description of embodiments with respect to the enclosed drawings.

FIGS. 2*a*-2*c* illustrate a MIMIMcap configuration in accordance with one or more embodiments of the disclosed technology.

FIGS. 3*a*-3*i* show the method of producing the MIMIMcap shown in FIGS. 2*a*-2*c*.

FIGS. 5*a*-5*e* illustrate the method for producing the MIMIMcap shown in FIGS. 4*a*-4*c*.

DETAILED DESCRIPTION OF CERTAIN ILLUSTRATIVE EMBODIMENTS

In the following detailed description, all cited materials and dimensions are merely stated by way of examples and do not limit the disclosed technology's scope.

Figure 1A:
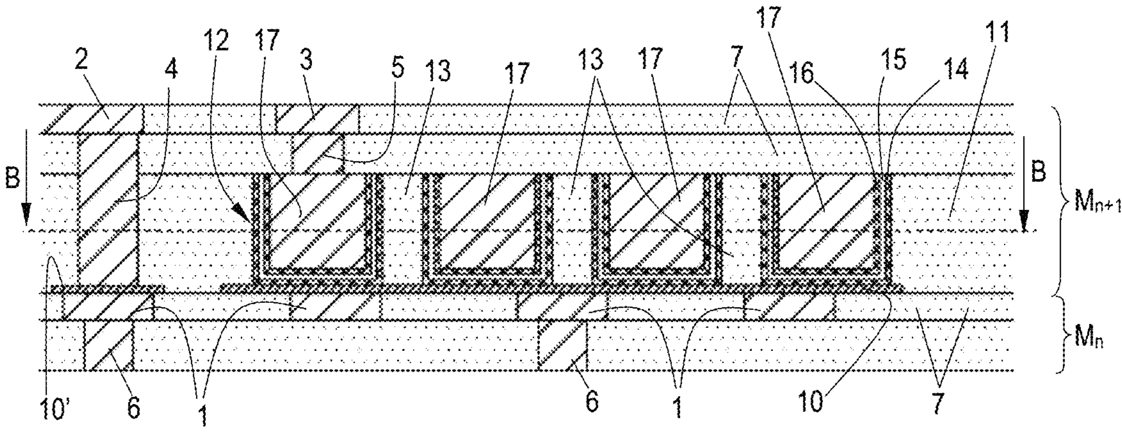
FIGS. 1*a*-1*c* illustrate a MIMcap.
Figure 1B:
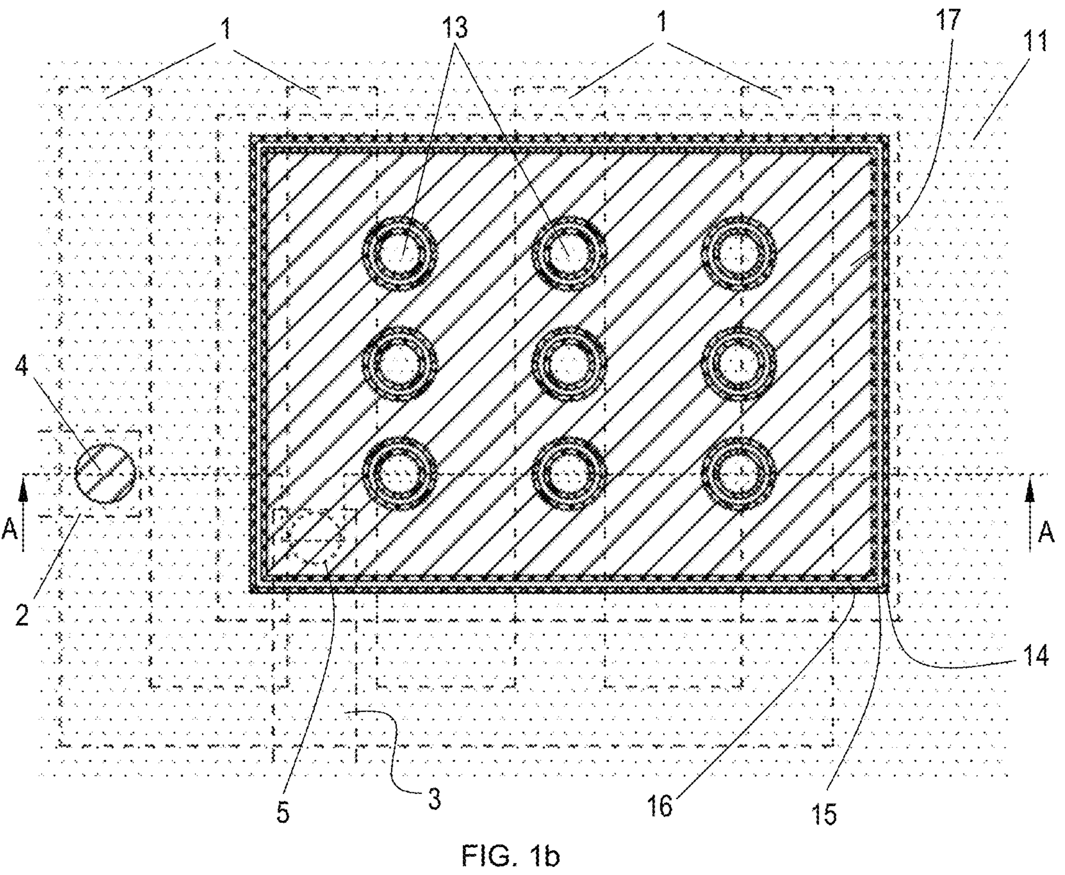

A conventional MIMcap is shown in the two section views of FIGS. 1*a* and 1*b*. The MIMcap is integrated between two adjacent levels $M_n$ and $M_{n+1}$ of a multilevel interconnect structure of a semiconductor component, for example, the BEOL portion on the front side of an integrated circuit chip or a power delivery network on the back side of the chip. Each level includes horizontal conductor lines 1,2,3, and vertical via connections 4,5,6. The via connections can interconnect the metal lines of the adjacent levels. The levels are numbered generically as n and n+1, where the n can be any integer from 1 upwards. The metal lines and via connections can be embedded in layers 7,11 of dielectric material, for example silicon oxide ($SiO_2$). The interconnect vias and the conductor lines may be formed of copper or other suitable metals produced by standard single or double damascene techniques.

Figure 1C:
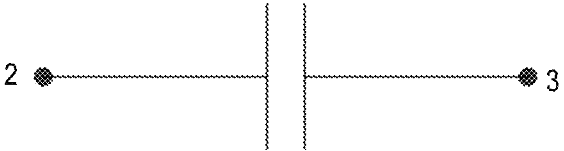

The MIMcap shown in FIGS. 1*a* and 1*b* can include a bottom plate 10 and dielectric layer 11. A patterned cavity 12 can be formed through the complete thickness of the dielectric layer 11. Dielectric pillars 13 can be distributed in a regular array on the bottom plate 10. As shown in FIGS. 1*a* and 1*b*, MIM stack 14/15/16 (conductive layers 14 and 16 with a dielectric layer 15) can be formed conformally, such as following the topography defined by the bottom and sidewalls of the cavity 12 and the sidewalls of the pillars 13. A continuous metal layer 17 can fill a portion (e.g., the remaining volume of the cavity 12). FIG. 1*b* illustrates an example layout of the conductor lines 1, via connections 4 and 5, and the conductor lines 2 and 3. FIG. 1*c* illustrates an equivalent electrical circuit of the MIMcap illustrated in FIGS. 1*a* and 1*b*, coupled between terminals 2 and 3. The MIMcap shown in FIGS. 1*a* and 1*b* can include a bottom plate 10 of about 50 nm in thickness, which may for example be formed of TaN. On the bottom plate 10 a thick dielectric layer 11 can be presented. The layer is shown as a single layer, but it may consist of several sublayers, for example one or more thin layers with a specific function, such as etch stop layers at the bottom, followed by a thick layer of silicon oxide, and again followed by a thin etch stop or other functional layer or layers. The total thickness of layer 11 can be higher in the case for a typical BEOL level and may be between one and two micrometers. A patterned cavity 12 can be formed through the complete thickness of the dielectric layer 11. As shown in FIGS. 1*a* and 1*b*, the cavity's circumference can lie within the boundary of the TaN bottom plate 10. The cavity 12 can be patterned in the sense that it does not have a flat bottom surface. Instead, dielectric pillars 13 can be distributed in a regular array on the bottom plate 10. The pillars may for example, have a diameter of about 200 nm. The cavity 12 can be obtained by a high aspect ratio lithography and etch process that removes the material of the dielectric layer 11 in the surface area of the cavity 12, except in the separate locations of the pillars 13. The cavity 12 can be a rectangular circumference, but this shape is can be different in practical applications, for example, more closely adjacent to and following the outer shape of the pillars 13. The array of pillars can also be different with every other row being shifted with respect to the adjacent rows so that the mutual distances between neighboring pillars is the same across the array. Also, the number of pillars 13 can considerably be higher than illustrated in FIGS. 1*a* and 1*b*.

As shown in FIGS. 1*a* and 1*b*, MIM stack 14/15/16 can be formed conformally, such as following the topography defined by the bottom and sidewalls of the cavity 12 and the sidewalls of the pillars 13. The MIM stack can include two electrically conductive layers 14 and 16, with a dielectric layer 15 located between the two conductive layers 14 and 16. The stack may consist for example of TiN (40 nm)/HfAlOx (10~20 nm)/TiN (20 nm). The notation HfAlOx is not a scientific formula but an abbreviation of the dielectric material hafnium aluminum oxide. The bottom layer 14 can be in direct contact with the bottom plate 10. A continuous metal layer 17 can fill the remaining volume of the cavity 12. During the production process, this metal layer 17 can be formed in the remaining volume and further covers the portions of the MIM layers which envelop the top of the pillars. The portions of the MIM layers and the metal 17 can then be removed from the upper surface of the pillars 13 by a planarization process such as chemical mechanical polishing (CMP), creating a top surface of the pillars that is coplanar with the continuous layer 17. This can enable the contacting of the continuous layer 17 by a via connection 5 of the $M_{n+1}$ level. An additional via connection 4 can be formed for contacting the conductor lines 1 of the level $M_n$ which are in direct contact with the bottom plate 10 of the MIMcap. Conductor lines 2 and 3 of the level $M_{n+1}$ respectively can contact the via connections 4 and 5. An example layout of the conductor lines 1, the via connections 4 and 5, and the conductor lines 2 and 3 is shown in the top view in FIG. 1*b*. This layout is merely provided as an example without limiting the MIMcap. FIG. 1*c* illustrates the equivalent electrical circuit of the MIMcap, coupled between terminals 2 and 3 which can represent the conductor lines with the same reference numerals 2 and 3 in FIGS. 1*a* and 1*b*.

FIGS. 2*a* and 2*b* illustrate an example of a double MIM stack (MIMIM) in accordance with one or more embodiments of the disclosed technology. The configuration of MIMIM can be distinct from the prior art MIMcap of FIGS. 1*a* and 1*b* in that it includes a double MIM stack. The configuration can enable the realization of two MIMcaps coupled in parallel by providing a contact to the middle conductive layer of the stack.

As shown in FIGS. 2*a* and 2*b*, many elements of the prior art configuration are maintained, and these elements are numbered by the same reference numerals as before: the conductors 1,2,3 and via connections 4,5,6 of the levels $M_n$ and $M_{n+1}$, the TaN bottom plate 10, the cavity 12 and the dielectric pillars 13. The MIMIM shown in FIGS. 2*a* and 2*b* can include a bottom plate 10 (for example, with a thickness of about 50 nm, which may for example be formed of TaN). On the bottom plate 10, a thick dielectric layer 11 can be presented. The layer is shown as a single layer, but it may consist of several sublayers, for example one or more thin layers with a specific function, such as etch stop layers at the bottom, followed by a thick layer of silicon oxide, and again followed by a thin etch stop or other functional layer or layers. The total thickness of layer 11 can be higher in the case of a typical BEOL level and may be between one and two micrometers. A patterned cavity 12 can be formed through the complete thickness of the dielectric layer 11. As shown in FIGS. 2*a* and 2*b*, the cavity's circumference can lie within the boundary of the TaN bottom plate 10. The cavity 12 can be patterned in the sense that it does not have a flat bottom surface. Instead, dielectric pillars 13 can be distributed in a regular array on the bottom plate 10. The pillars may for example, have a diameter of about 200 nm. The cavity 12 can be obtained by a high aspect ratio lithography and etch process that removes the material of the dielectric layer 11 in the surface area of the cavity 12, except in the separate locations of the pillars 13. The cavity 12 can be a rectangular circumference, but this shape is can be different in practical applications, for example, more closely adjacent to and following the outer shape of the pillars 13. The array of pillars can also be different with every other row being shifted with respect to the adjacent rows, so that the mutual distances between neighboring pillars are the same across the array. Also, the number of pillars 13 can considerably be higher than illustrated in FIGS. 2*a* and 2*b*. Conductor lines are not shown in FIG. 2*b*, however, the MIMIM can also include conductor lines.

In some embodiments, the three central pillars 13 (e.g., the central pillar 13 of FIG. 1*a*, and the three central pillars are shown as 13 in the top view shown in FIG. 2*b*) are lower in height than the outer pillars (e.g., the outer pillars, including 13*a* and 13*b* of FIG. 1*a*, and the three outer pillars are shown as 13*a* in the top view shown in FIG. 2*b*). Each outer pillar can include a base portion 13*a* and a top portion 13*b*. Also, the thick dielectric layer 11 may consist of a base portion 11*a* and a top portion 11*b*. The top portions 11*b* and 13*b* can be the part of the same layer formed of a dielectric material that can be removed by etching the layer selectively with respect to the material of the upper surface of layer 11*a*. The central pillars 13 may not include the top portion 13*b* and are therefore lower in height. The MIMIM stack can include a bottom conductive layer 20, an intermediate conductive layer 21, and a top conductive layer 22, with dielectric layers 23 and 24 separating adjacent conductive layers from each other. A continuous metal layer 17 can fill the remaining volume of the cavity. This metal layer can be planarized. In some embodiments, the upper surface of the metal layer can be coplanar only with the outer (higher) pillars of the array. The height difference between the central (lower) pillars and these outer pillars is such that the intermediate layer 21 of the MIMIM stack and its underlying layers 23 (dielectric) and 20 (bottom conductive layer) follow the topography of the top surface of lower-height pillars. Thus, the intermediate conductive layer 21 can be coplanar with the continuous metal layer 17 and with the upper surface of the higher pillars. The intermediate conductive layer 21 of the MIMIM stack can be available for contacting the layer by one or more via connections 8 and a conductor line 9 of the $M_{n+1}$ level. This can enable coupling the MIMIM stack as two MIMcaps in parallel by connecting the lines 2 and 3, as illustrated in FIG. 2*c* (e.g., an equivalent electrical circuit of the MIMIMcap illustrated in FIGS. 2*a* and 2*b*), thereby doubling the capacitance of the overall configuration.

The MIMIM stack can form an assembly of capacitors. Each capacitor can include two electrodes and a dielectric and can be formed by two adjacent conductive layers 20,21 and 21,22 of the stack and their separating dielectric layer 23,24. The bottom electrode 20 of the capacitor assembly, the top electrode 22 of the capacitor assembly, and the intermediate electrode 21 can be contacted through via connections 4,5,8 of the second level ($M_{n+1}$) of the interconnect structure.

Figures 3A, 3B, 3C, 3D, 3E:
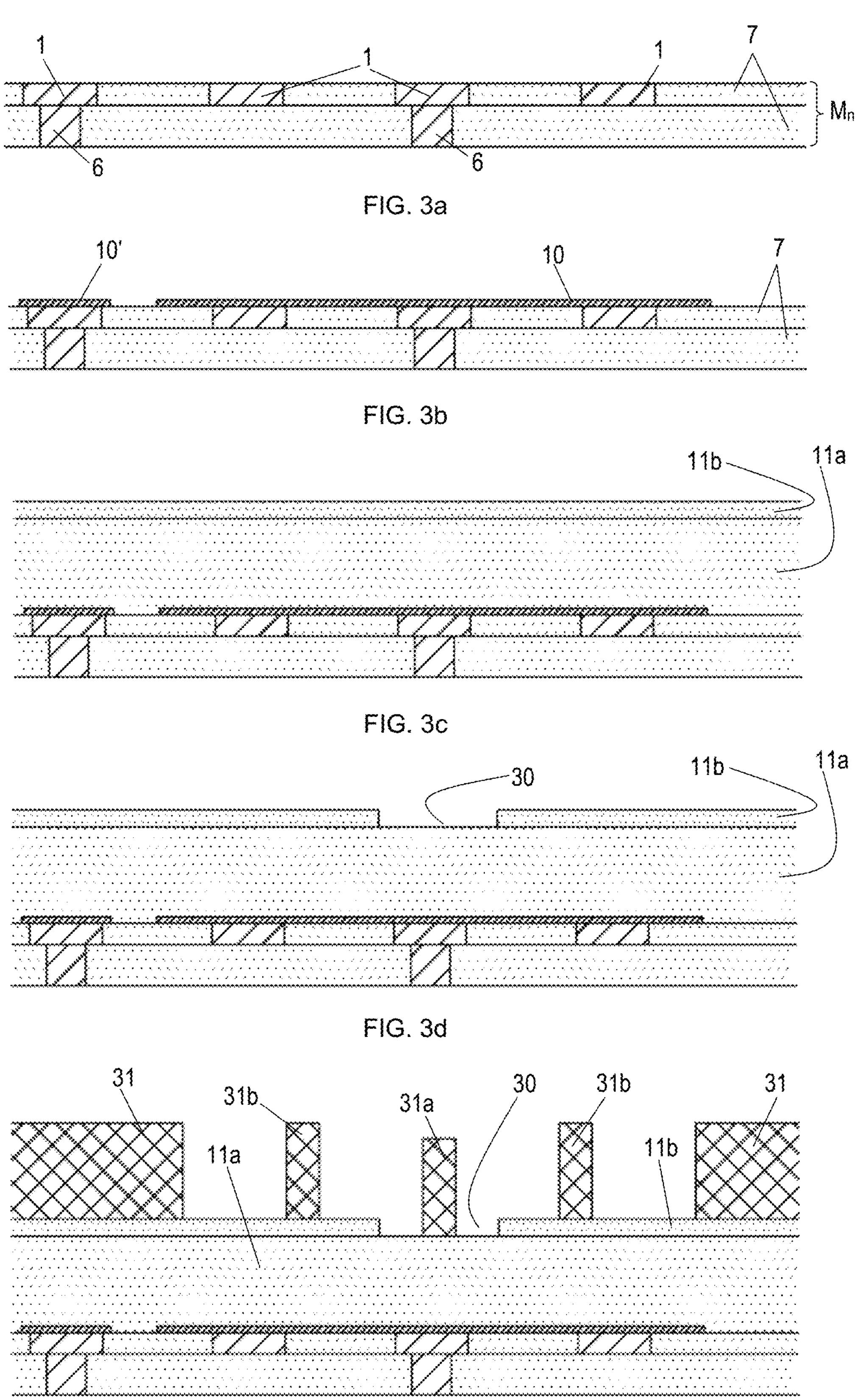

The method for producing the MIMIMcap structure of FIGS. 2*a*-2*b* is illustrated in FIGS. 3*a*-3*i*. The method may be applied on a Si process wafer on which a number of integrated circuit chips or other components are produced simultaneously. FIG. 3*a* shows a small portion of one particular integrated circuit produced on the wafer at an intermediate stage of the BEOL production process. FIG. 3*a* also shows a small section of the level $M_n$ of the chip's BEOL portion, such as after the completion of the level by standard damascene techniques. Underneath the structure shown in FIG. 3*a* can include the Si process wafer (not shown in FIG. 3*a*) with active devices (the front end of line portion) produced thereon and with the BEOL levels $M_1$ to $M_n$ extending above the FEOL.

As shown in FIG. 3*b*, on the planarized surface of the $M_n$ level, the bottom plate 10 can be produced by depositing and patterning a layer of TaN, for example, with a thickness of about 50 nm. A layer of TaN 10' can be maintained on all the Cu conductors 1 of the $M_n$ level in order to avoid contamination of the Cu by the etch process used for patterning the TaN. Deposition techniques, such as PVD (physical vapor deposition) and patterning techniques for TaN as well as other suitable materials can be used. Then the dielectric layer 11*a* can be produced, as shown in FIG. 3*c* by standard deposition techniques, such as CVD (chemical vapor deposition). Layer 11*a* may include several sublayers deposited consecutively, for example, starting with one or more thin functional layers. For example, etch stop layers, such as SiCN or SiCO layers of a few tens of nanometres thick, followed by a thick, such as 1 micrometer or more, layer of $SiO_2$. On the $SiO_2$ layer, a thin functional layer, for example, a SiCN layer of a few tens of nanometres thick, could be formed. The total thickness of layer 11 could be in the order of 1 to 2 micrometers.

Then an additional dielectric layer 11*b* can be deposited on layer 11*a*, as also illustrated in FIG. 3*c*. The thickness of the layer 11*b* can be controlled accurately and stands in relation to the thickness of the layers of the MIMIM stack, as will be described. Layer 11*b* can be a layer that can be removed selectively with respect to layer 11*a*, such that the surface material of layer 11*a* forms an etch stop surface when etching layer 11*b* by a suitable etch recipe. As shown in FIG. 3*d*, layer 11*b* can be patterned by standard lithography and etching. The material of layer 11*b* can be removed in one or more areas 30. In the method for producing the MIMIM shown in FIGS. 2*a* and 2*b*, three areas 30 can be produced in this way, at the locations where the respective three central pillars 13 of the pillar array are to be created.

The surface of the areas 30 can be larger than the cross section of the pillars (e.g., each of three pillars 13). The etch can selectivity enable the removal of layer 11*b* without substantial thinning of layer 11*a*. For example, layer 11*a* can include a layer of SiCN as its top layer, and layer 11*b* can include a layer of $SiO_2$. The $SiO_2$ can be etched selectively with respect to SiCN with a high degree of etch selectivity.

The stack of layers 11*a* and 11*b* can be patterned to form the cavity 12. The lithography and etching techniques can be used, for example by producing a multilayer patterned hardmask structure 31 (e.g., formed of amorphous carbon on top of the dielectric layer 11*a*+11*b*). The hardmask 31 can cover the areas of the pillars and the area surrounding the cavity location, as illustrated in FIG. 3*e*. As shown in FIG. 3*e*, the hardmask 31 can include pillar portions 31*a* placed centrally in the areas 30, such as on the exposed surface of layer 11*a* and other pillar portions 31*b* placed on the layer 11*b*. The etch process may include a sequence of consecutively applied etch recipes for removing each sublayer of the dielectric layer 11*a*+11*b*, until the cavity 12 can be formed with the bottom plate 10 exposed at the bottom of the cavity. After removing the hardmask 31, the pillars can be remained at the bottom of the cavity 12, as illustrated in FIG. 3*f*. As a consequence of the prior local removal of the layer 11*b*, the central pillars 13 can be lower in height than the outer pillars (e.g., each outer pillar including 13*a* and 13*b*), which include a base portion 13*a* and a top portion 13*b*, the latter being the remaining portion of layer 11*b*. Thus, the height difference can be equal to the original thickness of layer 11*b*.

Then, the MIMIM stack 20/23/21/24/22 can be deposited by deposition methods, as illustrated in FIG. 3*g*. The stack may include the same materials used in the single MIM stack. However, other materials may be used, and the intermediate conductive layer 21 can be thicker than the outer layers 20 and 22, as illustrated in FIG. 3*g*. Also, one or more conductive layers could consist of several sublayers. The sequence of layers of the MIMIM stack could, for example, be the following: from bottom to top can be about 20 nm TiN/10 nm HfAlOx/10 nm TiN/40 nm W/10 nm TiN/10 nm HfAlOx/10 nm TiN, such that the intermediate conductive layer 21 can be itself a stack of TiN, W and another TiN layer. The MIMIM stack can be deposited conformally on the topography defined by the cavity 12 and the pillars 13 (including the lower pillars 13 and the higher pillars 13*a*+13*b*). For example, the stack can follow the topography and become wrapped around the sidewalls and upper surfaces of the pillars. The spacing between the pillars 13 can be mutually, and between the pillars 13, and the sidewall of the cavity 12 can be designed with respect to the total thickness of the MIMIM stack. Thus, a considerable open volume can be left in the cavity after the MIMIM stack deposition. As illustrated in FIG. 3*h*, this open volume can be filled with an electrically conductive material 17, such as copper (Cu), which may be produced by electroplating. This may be preceded by the deposition of a barrier layer and a seed layer (not shown in FIG. 3*h*). The Cu can fill the remaining volume of the cavity 12 and thereafter can get deposited as a horizontal layer 17' on the entire upper surface of the wafer.

A planarization process can be performed, and FIG. 3*i* illustrates the results of the process. The process may include several material removal steps, such as grinding steps, and CMP steps according to suitable CMP recipes in order to remove the Cu layer 17'. In addition, the step can include removing the MIMIM layers from the upper surface of layer 11*b*. The planarization process can be stopped when the upper surface of the layer 11*b* becomes exposed (with possibilty removing a small fraction of this layer at the end of the process). By an accurate control of the thickness of this layer 11*b* with respect to the combined thickness of layers 20, 23 and 21 of the MIMIM stack, the planarization process can result in the coplanarity of the higher pillars 13*a*+13*b*, the continuous Cu layer 17 that fills the cavity, and a thinned and planarized portion of intermediate conductive layer 21 of the MIMIM stack, the latter becoming available for contacting in the areas above the lower-height pillars.

For example, when the MIMIM stack, as described above, corresponds to, for example, 20 nm TiN/10 nm HfAlOx/10 nm TiN/40 nm W/10 nm TiN/10 nm HfAlOx/10 nm TiN, the combined thickness of layers 20, 23 and 21 can be 90 nm with layer 21 being 60 nm thick. Therefore, in order to accurately stop the process (e.g., accurately know that when the CMP stops on the surface of layer 11*b*), about one half of layer 21 can be removed. Then, the remaining part becomes available for contacting, and the layer 11*b* can be about 60 nm thick (combined thickness of layer 20, 23 and one half of layer 21). A safety range could be applied, for example of 50-70 nm thickness. Thus, an accurate control of the various thicknesses and process steps can be required in order to obtain the desired result.

In some embodiments, additional damascene-type process steps can be performed, and the via connections 4 and 5 and the conductor lines 2 and 3 of level $M_{n+1}$ are then produced, resulting in the configuration shown in FIGS. 2*a* and 2*b*.

Figures 4A, 4B, 4C:
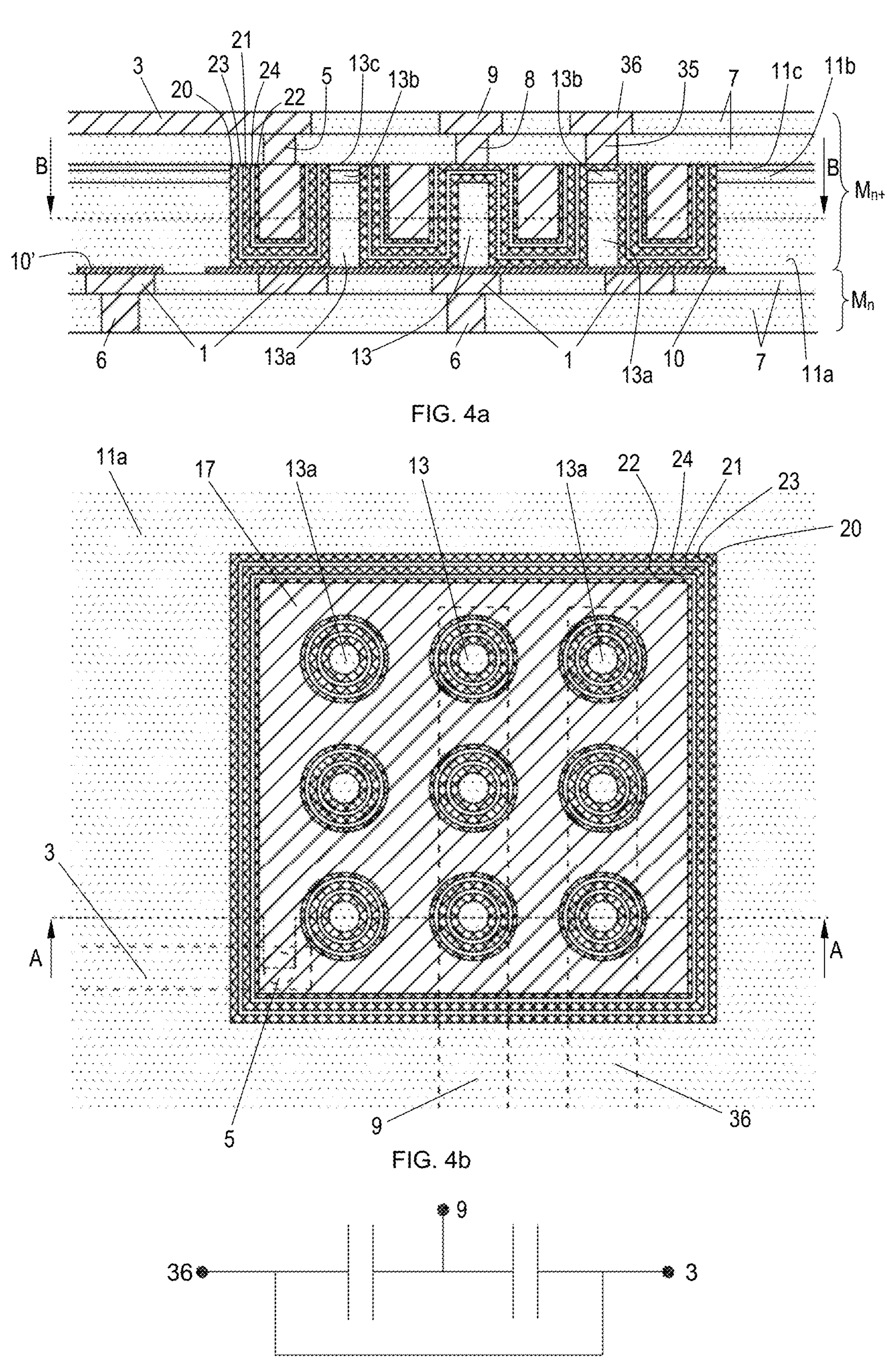
FIGS. 4*a*-4*c* illustrate a MIMIMcap configuration in accordance with one or more embodiments of the disclosed technology.

Another embodiment is illustrated in FIGS. 4*a*-4*c*. The elements appearing in the previous embodiment have been numbered by the same reference numerals. The conductors 1 in level $M_n$ can be patterned, as described with respect to FIG. 2*b*. The difference with the embodiments of FIGS. 2*a* and 2*b* can be that the deep via connection 4 to the bottom plate 10 may not required in the embodiments illustrated in FIGS. 4*a* to 4*c*. Instead, the bottom plate 10 can be contacted by a shorter via connection 35 and a contact line 36 in the $M_{n+1}$ level. This can be realized by further subdividing the pillar heights. The pillars of the left-hand side row of pillars can consist of portions 13*a*, 13*b*, and 13*c*. The middle row can consist of the base portion 13*a*, while the right-hand side pillars can consist of portions 13*a* and 13*b*. The dielectric layer 11 can consist of portions 11*a*, 11*b*, and 11*c*. The height difference 13*c* can be configured so that the bottom conductive layer 20 of the MIMIM stack can be wrapped around the upper surface of the "middle-height" pillars (13*a*+13*b*). Thus, this bottom layer 20 can become available for contacting it by a short via connection 35 and a metal line 36. The intermediate conductive layer 21 of the MIMIM stack can be available for contacting in areas above the "lowest" pillars in the centre row. A possible layout of the conductor lines 2, 3 and 36 is illustrated in FIG. 2*b*, enabling the realization of the parallel capacitor circuit illustrated in FIG. 4*c*. FIG. 4*c* illustrates an equivalent circuit diagram of FIGS. 4*a*-4*b*.

Figure 5E:
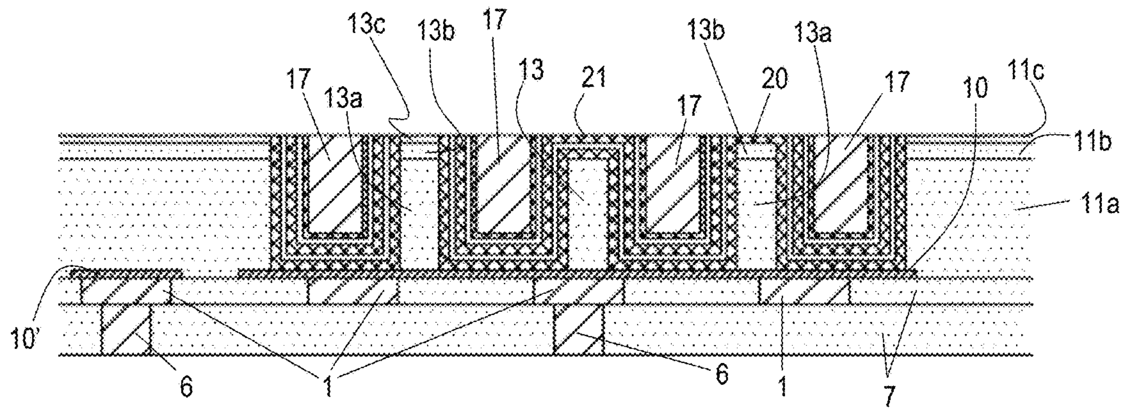

The method for producing the MIMIM shown in FIGS. 4*a* and 4*b* is illustrated in FIGS. 5*a*-5*e*. This method can include similar steps as described in FIGS. 3*a*-3*c* (e.g., up to the step of depositing the layer 11*b*). As shown in FIG. 5*a*, an additional dielectric layer 11*c* can be deposited on layer 11*b*. Layer 11*c* can be formed of a material that can be etched selectively with respect to the surface material of layer 11*b*. Two patterning steps can be then performed, as illustrated in FIG. 5*b*, by creating openings 40 through the top layer 11*c* and 41 through both layers 11*b* and 11*c*. The openings can be produced using etch recipes which exhibit etch selectivity in the sense that the etch process essentially removes no material from the underlying layers once the bottom of the openings is reached.

After producing the hardmask for defining the cavity and the array of pillars, the cavity 12 and the pillars are produced, as illustrated in FIG. 5*c*. Three sets of pillars can be obtained, each having a different height. Then the MIMIM stack can be deposited, as illustrated in FIG. 5*d*, followed by the deposition and planarization of the Cu layer 17 illustrated in FIG. 5*e*. By tuning the thicknesses of layers 11*b* and 11*c* with respect to the layers of the MIMIM stack, the planarization process can result in the availability of both the bottom conductive layer 20 and the middle conductive layer 21 for contacting by via connections of the $M_{n+1}$ level, as shown in FIGS. 4*a* and 4*b*.

These embodiments of MIMIM described with respect to FIGS. 4*a*-4*c* and 5*a*-5*e* can be advantageous in that it does not require etching a deep opening through the thick layer 11 for producing the via connection 4 to the bottom plate 10. These embodiments can be further expanded to realize a circuit including more than two capacitors. This can be done by creating additional pillar heights by depositing additional layers 11*d*, 11*e* etc, with suitable etch selectivities of each layer relative to the layer beneath it.

Figure 6A:
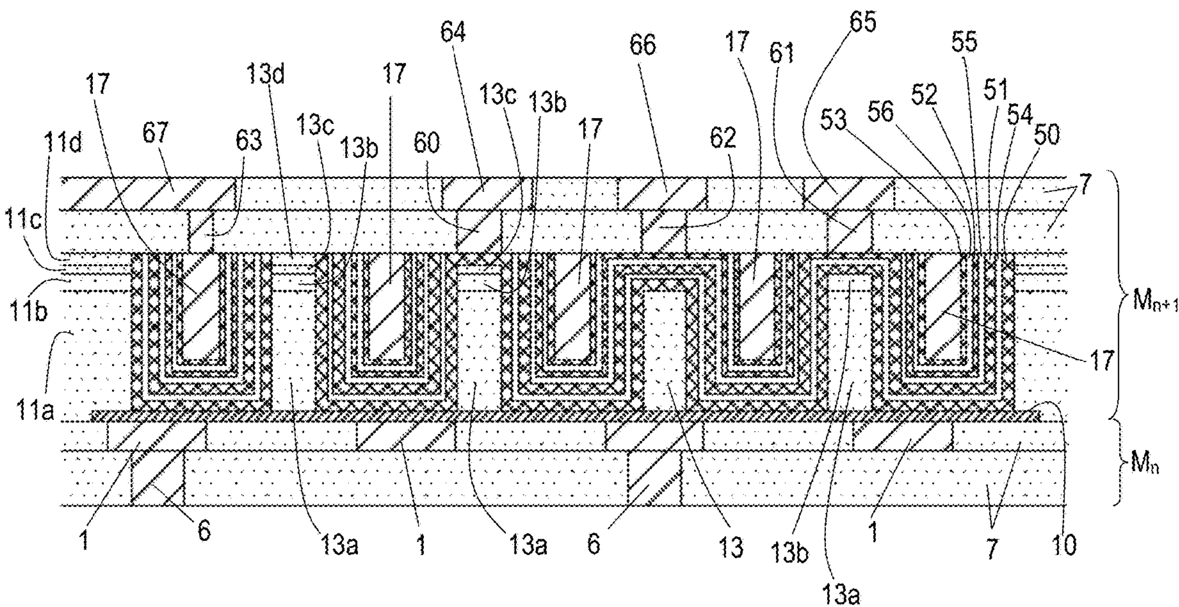
FIGS. 6*a*-6*b* illustrate MIMIMcap configurations, including three MIM capacitors in accordance with one or more embodiments of the disclosed technology.
Figure 6B:
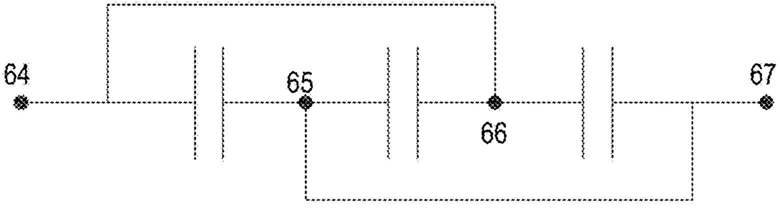

Additional embodiments of the disclosed technology, including 3 MIMcaps, is illustrated in FIG. 6*a*. The dielectric layer 11 can include sublayers 11*a*, 11*b*, 11*c*, and 11*d*, where layers 11*b*,11*c*, and 11*d* are removable selectively with respect to their respective underlying layers. In analogy with FIG. 5*b*, openings of 3 different depths can be created through respective layers 11*d*, 11*c*+11*d*, and 11*b*+11*c*+11*d*, followed by the formation of the hardmask and the etching of the cavity 12, including pillars of 4 different heights: 13, 13*a*+13*b*, 13*a*+13*b*+13*c* and 13*a*+13*b*+13*c*+13*d*. The addition of layer 11*d* thereby can enable the addition of a third MIMcap to the stack, as illustrated in the resulting structure shown in FIG. 6*a* and including a three-fold (MI-MI-MI-M) stack consisting of electrically conductive layers 50, 51, 52 and 53, separated by dielectric layers 54, 55 and 56. The conductive layers 50 to 53 can be contacted by via connections 60 to 63 and conductor lines 64 to 67. FIG. 6*b* illustrates an equivalent circuit diagram of FIG. 6*a*.

Figure 7A:
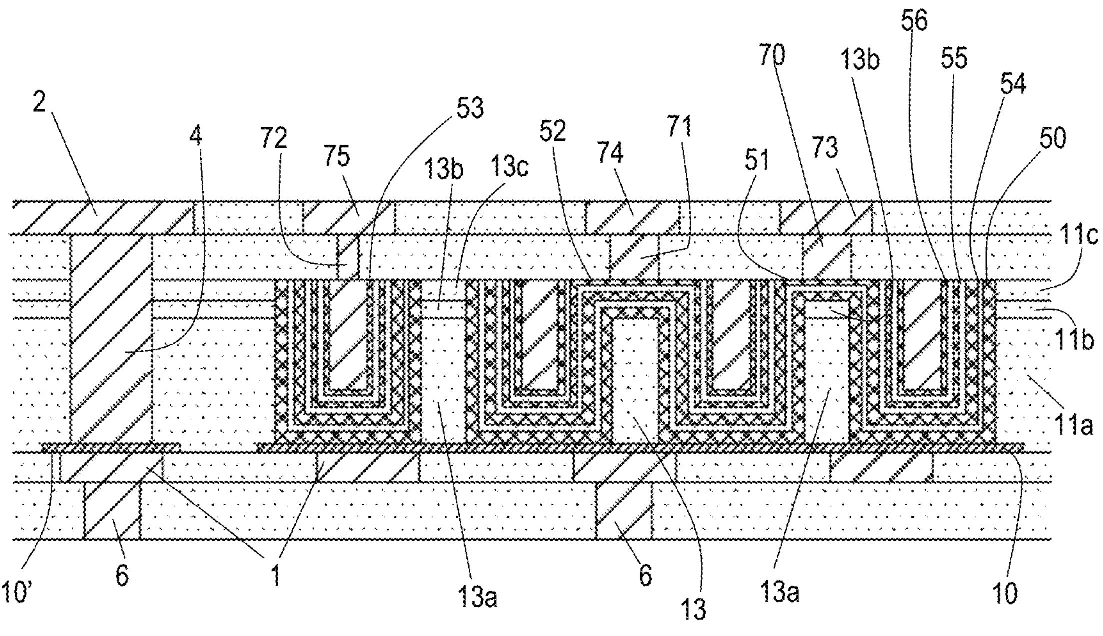
FIGS. 7*a* and 7*b* illustrate alternative MIMIMcap configurations, including three MIM capacitors in accordance with one or more embodiments of the disclosed technology.
Figure 7B:
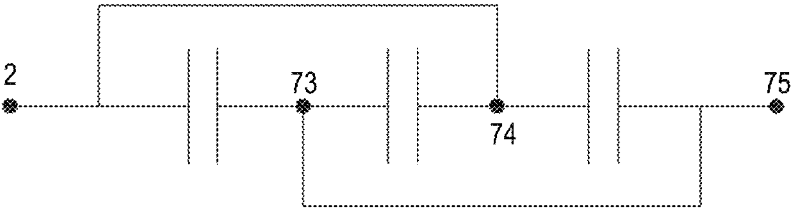

The embodiment of FIGS. 2*a*-2*c* and 3*a*-3*i* (with the deep via connection 4) can also be expanded to more than two capacitors, requiring one less additional dielectric layer 11*b*, 11*c* for the same number of capacitors, compared to the embodiments of FIGS. 4 and 5. FIGS. 7*a*-7*b* illustrate a structure of MIMIMIM stack 50/54/51/55/52/56/53 (3 capacitors). Layers 11*b* and 11*c* can be required on top of layer 11*a* for contacting the second and third conductive layers 51 and 52 through via connections 70 and 71 and metal lines 73 and 74. The top conductive layer 53 can be contacted through via connection 72 and metal line 75. The bottom conductive layer 50 can be contacted through the via connection 4 and metal line 2, as in the embodiment of FIGS. 2*a*-2*b*. The equivalent circuit of FIG. 6*b* can also be realized with this configuration, as illustrated in FIG. 7*b*.

While the disclosed technology has been illustrated and described in detail in the drawings and foregoing description, such illustration and description are to be considered illustrative or exemplary and not restrictive. Other variations to the disclosed embodiments can be understood and effected by those skilled in the art in practicing the claimed disclosed technology, from a study of the drawings, the disclosure and the appended claims. In the claims, the word "including" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

What is claimed is:

1. A semiconductor component comprising a multilayer interconnect structure, the multilayer interconnect structure comprising:

electrical conductor lines and via connections embedded in layers of dielectric material;

a conductive bottom plate on one or more conductor lines of a first level of the multilayer interconnect structure;

a dielectric layer included in a second level of the multilayer interconnect structure, wherein the second level lies directly above the first level, wherein the dielectric layer is lying directly on the conductive bottom plate, and wherein the dielectric layer comprises a cavity through a full thickness of the dielectric layer and lying within boundaries of the conductive bottom plate;

a plurality of pillars of dielectric material distributed on the conductive bottom plate;

a stack of layers comprising electrically conductive layers including a bottom layer, a top layer, and at least one intermediate layer, wherein the stack of layers further comprises dielectric layers which separate the electrically conductive layers from each other, and wherein the stack of layers is arranged based on a topography defined by the conductive bottom plate, sidewalls of one or more pillars of the plurality of pillars, and sidewalls of the cavity; and a continuous layer of electrically conductive material that fills a remaining volume of the cavity and is in direct contact with the top layer of the stack of layers, wherein the pillars or several subgroups of pillars have different heights, and wherein each intermediate layer of the stack of layers and underlying layers of the intermediate layer are defined by a topography defined by top surfaces of one or more pillars, and wherein in separate areas above the top surfaces of one or more pillars, an upper surface of each intermediate layer is coplanar with an upper surface of the continuous layer; and a plurality of via connections of the second level of the multilayer interconnect structure, the plurality of via connections including:

one or more via connections in direct contact with the upper surface of the continuous layer;

one or more via connections in direct contact with each intermediate layer of the stack of layers in the one or more separate areas; and one or more via connections in direct or indirect contact with the bottom layer of the stack of layers, such that the stack of layers forms an assembly of capacitors comprising a plurality of capacitors, each capacitor formed by two adjacent ones of the electrically conductive layers of the stack of layers serving as two electrodes and one of the dielectric layers separating the two electrodes, and wherein a bottom electrode and a top electrode of the assembly of capacitors and each intermediate layer are contacted through the plurality of via connections of the second level.

2. The semiconductor component of claim 1, wherein a height of each of the one or more pillars is defined in a way that the bottom layer of the stack of layers is defined by the topography defined by upper surfaces of the one or more pillars, and wherein:

the bottom layer is coplanar with the continuous layer in corresponding additional separate areas, lying above the one or more pillars, and one or more via connections of the second level are in direct contact with the bottom layer of the corresponding additional separate areas.

3. The semiconductor component of claim 1, wherein the second level comprises one or more via connections which are in indirect contact with the bottom layer of the stack of layers, and wherein the indirect contact is realized by:

the one or more via connections through the dielectric layer; and the one or more via connections that are in electrical contact with a conductor line of the first level, wherein the conductor line is in electrical contact with the conductive bottom plate.

4. The semiconductor component of claim 1, wherein the semiconductor component is a semiconductor chip, and wherein the multilayer interconnect structure is a BEOL portion formed on a front side of the semiconductor chip.

5. The semiconductor component of claim 1, wherein the semiconductor component is a semiconductor chip, and wherein the multilayer interconnect structure is a power delivery network formed on a back side of the chip.

6. The semiconductor component of claim 1, wherein the assembly of capacitors comprises at least two capacitors coupled in parallel.

7. The semiconductor component of claim 1, wherein heights of each pillar of the plurality of pillars is different.

* * * * *